United States Patent
Gao et al.

(10) Patent No.: US 9,407,020 B2
(45) Date of Patent: Aug. 2, 2016

(54) EDGE MOUNT CONNECTOR

(75) Inventors: Zheng Gao, San Jose, CA (US); Joshua Funamura, Cupertino, CA (US); Phillip Satterfield, Oakland, CA (US); Bartley K. Andre, Menlo Park, CA (US); Greg Springer, Orinda, CA (US); Jason Richard Minahan, San Jose, CA (US)

(73) Assignee: Apple Inc., Cupertino, CA (US)

( * ) Notice: Subject to any disclaimer, the term of this patent is extended or adjusted under 35 U.S.C. 154(b) by 488 days.

(21) Appl. No.: 13/605,691

(22) Filed: Sep. 6, 2012

(65) Prior Publication Data

US 2013/0149878 A1    Jun. 13, 2013

Related U.S. Application Data

(60) Provisional application No. 61/531,556, filed on Sep. 6, 2011.

(51) Int. Cl.
| | |
|---|---|
| *H01R 12/57* | (2011.01) |
| *H01R 12/70* | (2011.01) |
| *H05K 3/34* | (2006.01) |
| *H01R 12/58* | (2011.01) |
| *H01R 12/72* | (2011.01) |
| *H05K 1/18* | (2006.01) |

(52) U.S. Cl.
CPC ............ *H01R 12/7082* (2013.01); *H01R 12/58* (2013.01); *H01R 12/721* (2013.01); *H05K 1/184* (2013.01); *H05K 3/3405* (2013.01); *H05K 2201/09181* (2013.01); *H05K 2201/10189* (2013.01); *Y10T 29/49149* (2015.01)

(58) Field of Classification Search
CPC .. H01R 12/721; H01R 13/6658; H01R 12/57; H01R 12/707; H01R 12/716
USPC ................................................. 439/61, 71, 82
See application file for complete search history.

(56) References Cited

U.S. PATENT DOCUMENTS

| | | | | |
|---|---|---|---|---|
| 2,685,074 | A * | 7/1954 | Lazzery | 439/723 |
| 5,200,884 | A * | 4/1993 | Ohashi | H01H 1/5805 200/295 |
| 5,244,395 | A * | 9/1993 | DeSantis | H05K 3/366 439/65 |
| 5,383,095 | A * | 1/1995 | Korsunsky et al. | 361/785 |
| 6,224,388 | B1 * | 5/2001 | Ahr et al. | 439/55 |
| 6,287,130 | B1 * | 9/2001 | Torii | H01R 12/707 439/83 |
| 7,497,732 | B2 * | 3/2009 | Yi | 439/607.23 |
| 7,704,082 | B2 * | 4/2010 | Daily | H01R 12/57 439/83 |
| 2012/0171886 | A1 * | 7/2012 | Gondosch et al. | 439/345 |
| 2012/0302072 | A1 * | 11/2012 | Hsu et al. | 439/61 |

* cited by examiner

*Primary Examiner* — Truc Nguyen
(74) *Attorney, Agent, or Firm* — Kilpatrick Townsend & Stockton LLP

(57) ABSTRACT

Connector receptacles that have a reduced height when combined with a printed circuit board and reduce wasted space inside an electronic device. One example provides a connector receptacle having contacts that may connect to edge contacts along an edge of a printed circuit board. This edge may be formed along a side of printed circuit board, by a hole or opening in a printed circuit board, or by a notch in a printed circuit board. Edge contacts may have straight surfaces, rounded surfaces, or they may have other types of surfaces. Connector receptacle contacts may have a "U," fishhook, or other shape.

12 Claims, 10 Drawing Sheets

EDGE MOUNT CONNECTOR

CROSS-REFERENCES TO RELATED APPLICATIONS

This application claims the benefit of U.S. provisional patent application No. 61/531,556, filed Sep. 6, 2011, which is incorporated by reference.

BACKGROUND

The number and types of electronic devices available to consumers have increased tremendously the past few years, and this increase shows no signs of abating. Devices such as portable computing devices, tablet, desktop, and all-in-one computers, cell, smart, and media phones, storage devices, portable media players, navigation systems, monitors and other devices have become ubiquitous.

These devices often receive power and share data using various cables. These cables may have connector inserts, or plugs, on each end. The connector inserts may plug into connector receptacles on electronic devices, thereby forming one or more conductive paths for signals and power.

Devices typically have openings that allow access to connector receptacles. These openings may provide access to one or more contacts in the receptacles, which may mate with corresponding contacts in connector inserts. The connector receptacles often are located on a printed circuit board, such as a main or mother board. The one or more contacts in the connector receptacle may connect to corresponding traces on the printed circuit board.

These various electronic devices are continually becoming thinner and more sleek. That is, the trend is away from thicker, bulkier devices. But stacking a connector insert on a printed circuit board in this way limits the possible height or thickness of a device. That is, a device has to be high or thick enough to encase both the height of a printed circuit board and a connector receptacle.

The portion of a printed circuit board where a connector receptacle resides is not typically used for any purpose other than to provide mechanical support for the connector receptacle and to provide traces for connection to the contacts in the connector receptacle such that signals and power supplies may be conveyed to and from other circuits on the printed circuit board. This means that some printed circuit board area is wasted, which wastes space inside the electronic device.

Thus, what is needed are connector receptacles that have a reduced height when mated with a printed circuit board and reduce wasted printed circuit board area.

SUMMARY

Accordingly, embodiments of the present invention provide connector receptacles that have a reduced height when combined with a printed circuit board and reduce wasted space inside an electronic device. An exemplary embodiment of the present invention provides a connector receptacle that fits in an opening in a printed circuit board. Connector receptacle contacts mate with contacts along edges of the opening in the printed circuit board. This arrangement provides a connector receptacle assembly that has reduced height and reduces wasted space inside an electronic device.

An exemplary embodiment of the present invention provides a connector receptacle having contacts that may connect to edge contacts along an edge of a printed circuit board. In various embodiments of the present invention, a connector receptacle may have contacts that attach to an edge along a side of printed circuit board, an edge formed by a hole or opening in a printed circuit board, an edge formed by a notch in a printed circuit board, or other printed circuit board edge. In a specific embodiment of the present invention, a connector receptacle has contacts that attach to an edge of a hole or opening in a printed circuit board that is formed by a router. While embodiments of the present invention are well-suited for use with printed circuit boards, embodiments of the present invention may be used with flexible circuit boards, or other appropriate substrates.

Another exemplary embodiment of the present invention provides edge contacts for mating to contacts of a connector receptacle. These edge contacts may have straight or flat surfaces, rounded surfaces, or other types of surfaces. In a specific embodiment of the present invention, concave, rounded surfaces may be formed by starting with a plated through-hole or via in a printed circuit board. The printed circuit board may be cut along a middle of the through-hole, for example by a router, laser, or other method. One-half of the through-hole may be removed, while the remaining one-half of the through-hole remaining on a new edge of the printed circuit board may remain, thereby forming an edge contact with a curved or rounded surface. In another specific embodiment of the present invention, the edge contacts may have flat surfaces. These contacts may be formed by plating an edge of a printed circuit board, then removing material between the contacts by laser, photolithography, or other method. In other embodiments of the present invention, other surfaces, such as surfaces formed by notches, or 45-degree angles, may be formed.

In various embodiments of the present invention, these edge contacts may be reinforced by plating nearby areas on the various layers of the printed circuit board. In one specific embodiment of the present invention, a through-hole or via may be located near an edge contact. The through-hole may be plated and connected to the edge contact on various layers. Also, other materials or layers may be placed along edges of the printed circuit board to increase adhesion between an edge contact and an edge of the printed circuit board.

An exemplary embodiment of the present invention provides connector receptacle contacts that may be placed in, or located adjacent to, edge contacts on a printed circuit board. The connector receptacle and edge contacts may be soldered together by a reflow or other soldering process. The connector receptacle contacts may have a "U," fishhook, or other shape. The connector receptacle contacts may be shaped such that they provide a spring tension to maintain a fit between the connector receptacle and printed circuit board during assembly.

In various embodiments of the present invention, connector receptacle contacts may have various features to improve a connection to an edge contact. In a specific embodiment of the present invention, a connector receptacle contact may have a bump or dimpled surface. This raised portion may provide clearance between a connector receptacle contact and an edge contact such that a channel or space for reflowing solder is formed. In other embodiments of the present invention, other surface features may be used.

Embodiments of the present invention may provide connector receptacles for various types of devices, such as portable computing devices, tablet, desktop, and all-in-one computers, cell, smart, and media phones, storage devices, portable media players, navigation systems, monitors and other devices. These connector receptacles may provide pathways for signals and power compliant with various standards such as Universal Serial Bus (USB), a High-Definition Multimedia Interface (HDMI), Digital Visual Interface (DVI), power, Ethernet, DisplayPort, Thunderbolt, and other types of interfaces.

While embodiments of the present invention are particularly suited to connector receptacles that accept connector inserts, embodiments of the present invention may be used to form other connections. For example, board-to-board, wire-to-board, and other types of connections may be improved by employing embodiments of the present invention.

Various embodiments of the present invention may incorporate one or more of these and the other features described herein. A better understanding of the nature and advantages of the present invention may be gained by reference to the following detailed description and the accompanying drawings.

DESCRIPTION OF ILLUSTRATIVE EMBODIMENTS

Figure 1:
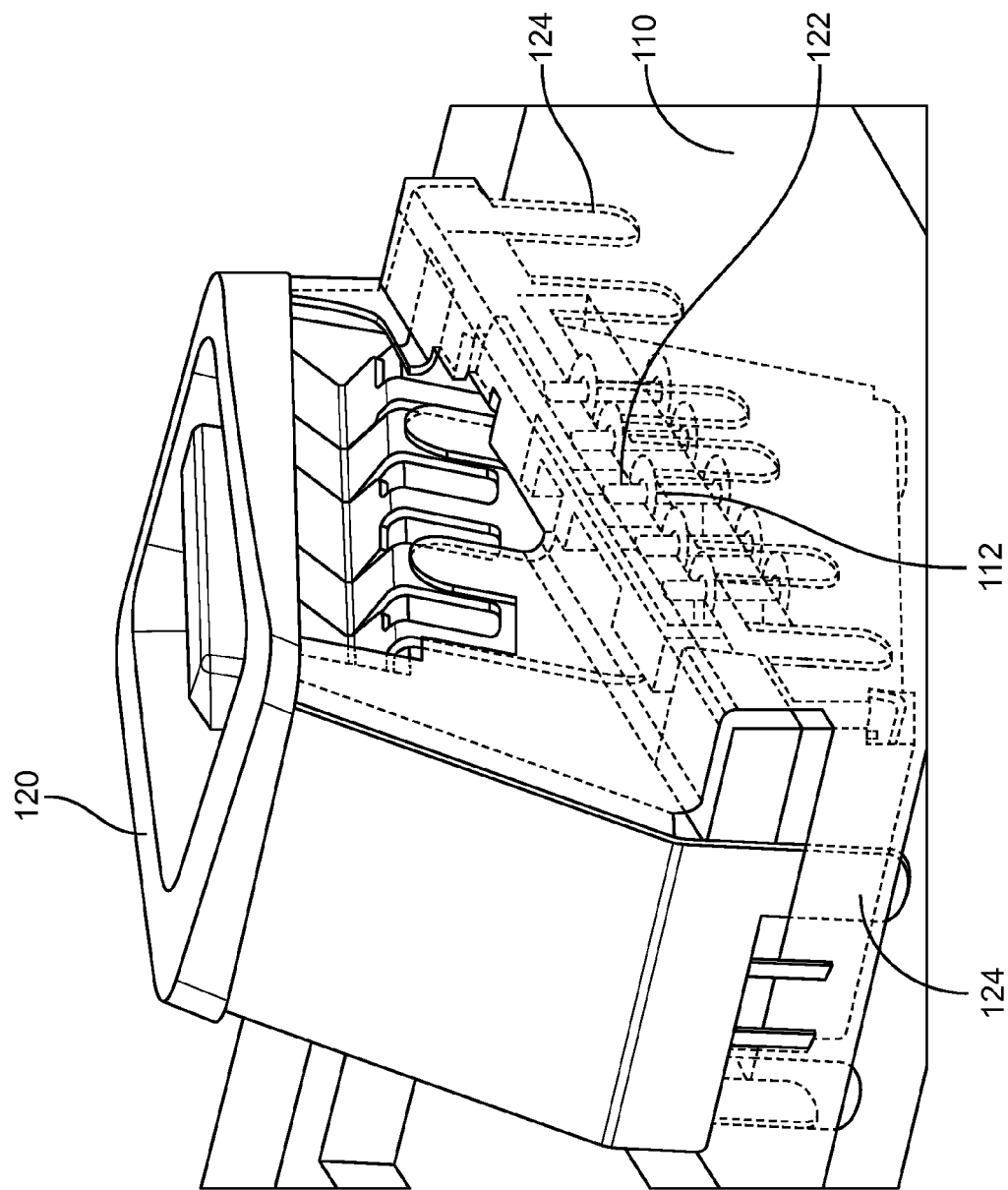
FIG. 1 is a cutaway view of a connector receptacle assembly according to an embodiment of the present invention.

FIG. 1 is a cutaway view of a connector receptacle assembly according to an embodiment of the present invention. This figure, as with the other included figures, is shown for illustrative purposes and does not limit either the possible embodiments of the present invention or the claims.

This figure includes printed circuit board 110 and connector receptacle 120. Connector receptacle 120 may be located in an opening in printed circuit board 110. In this specific implementation, connector receptacle 120 may be angled along at least one axis relative to printed circuit board 110, though in other embodiments of the present invention, connector receptacle 120 may be orthogonal or at other angles relative to printed circuit board 110.

Connector receptacle 120 may include contacts 122. Contacts 122 may be arranged to be soldered or otherwise fixed to edge contacts 112. Shield tabs 124 may also be connected to printed circuit board 110. For example, shield tabs 124 may be connected to a ground plane (not shown) on printed circuit board 110.

In this example, connector receptacle 120 may be a USB3 connector receptacle, though in other embodiments of the present invention, connector receptacle 120 may be other types of connector receptacles, such as a High-Definition Multimedia Interface (HDMI), Digital Visual Interface (DVI), power, Ethernet, DisplayPort, Thunderbolt, and other types of receptacle.

Printed circuit board 110 may be a main logic board, motherboard, or other type of printed circuit board. In other embodiments of the present invention, board 110 may be a flexible circuit board or other appropriate type of substrate.

While embodiments of the present invention are particularly suited to connector receptacles fitted in openings in printed circuit boards, in other embodiments of the present invention, other connections may be made. For example, board-to-board, wire-to-board, or other types of connections may be formed using embodiments of the present invention. Again, while embodiments of the present invention are particularly suited to printed circuit boards, such as main logic boards or motherboards, various embodiments of the present invention may be employed with flexible circuit boards, or other substrates.

Figure 2:
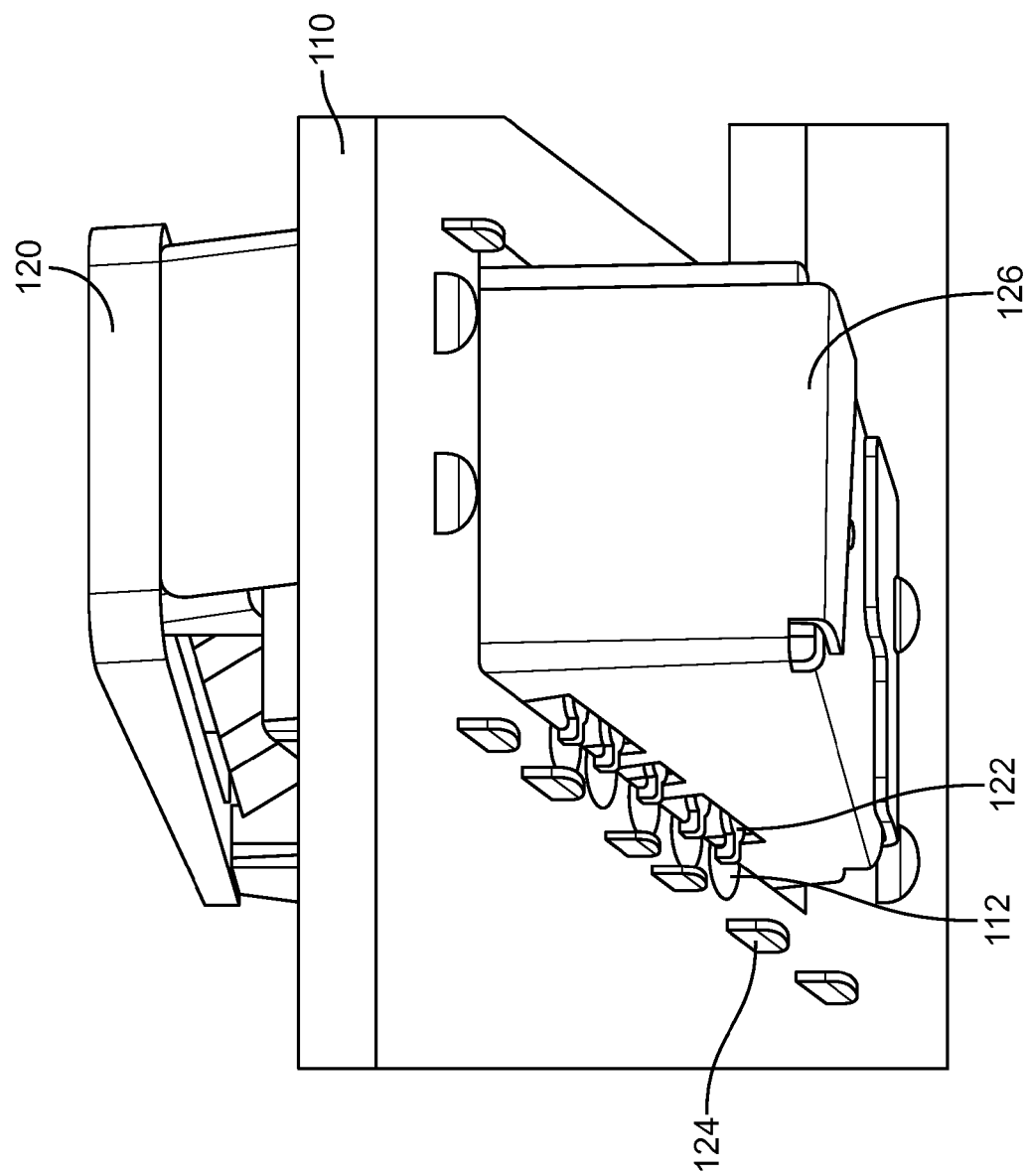
FIG. 2 illustrates an underside of a connector receptacle assembly according to an embodiment of the present invention.

FIG. 2 illustrates an underside of a connector receptacle assembly according to an embodiment of the present invention. In this example, connector receptacle 120 may be protected by shield 126, which may be connected to printed circuit board 110 by tabs 124. Connector receptacle contacts 122 may be soldered to edge contacts 112.

Figure 3:
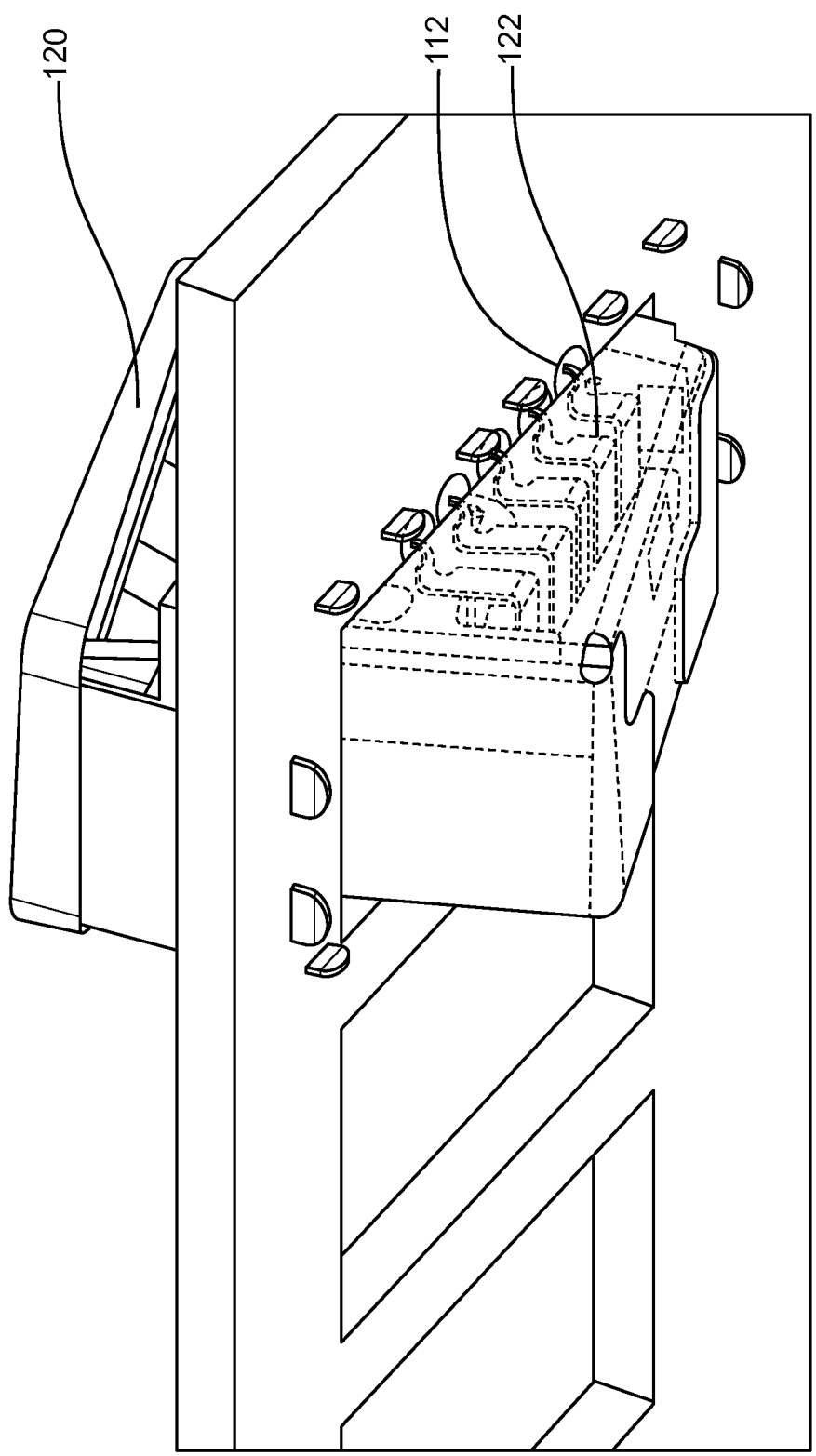
FIG. 3 illustrates a cutaway underside side view of a connector receptacle assembly according to an embodiment of the present invention.

FIG. 3 illustrates a cutaway underside side view of a connector receptacle assembly according to an embodiment of the present invention. Again, contacts 122 of connector receptacle 120 may be soldered or otherwise fixed to edge contacts 112.

Figure 4:
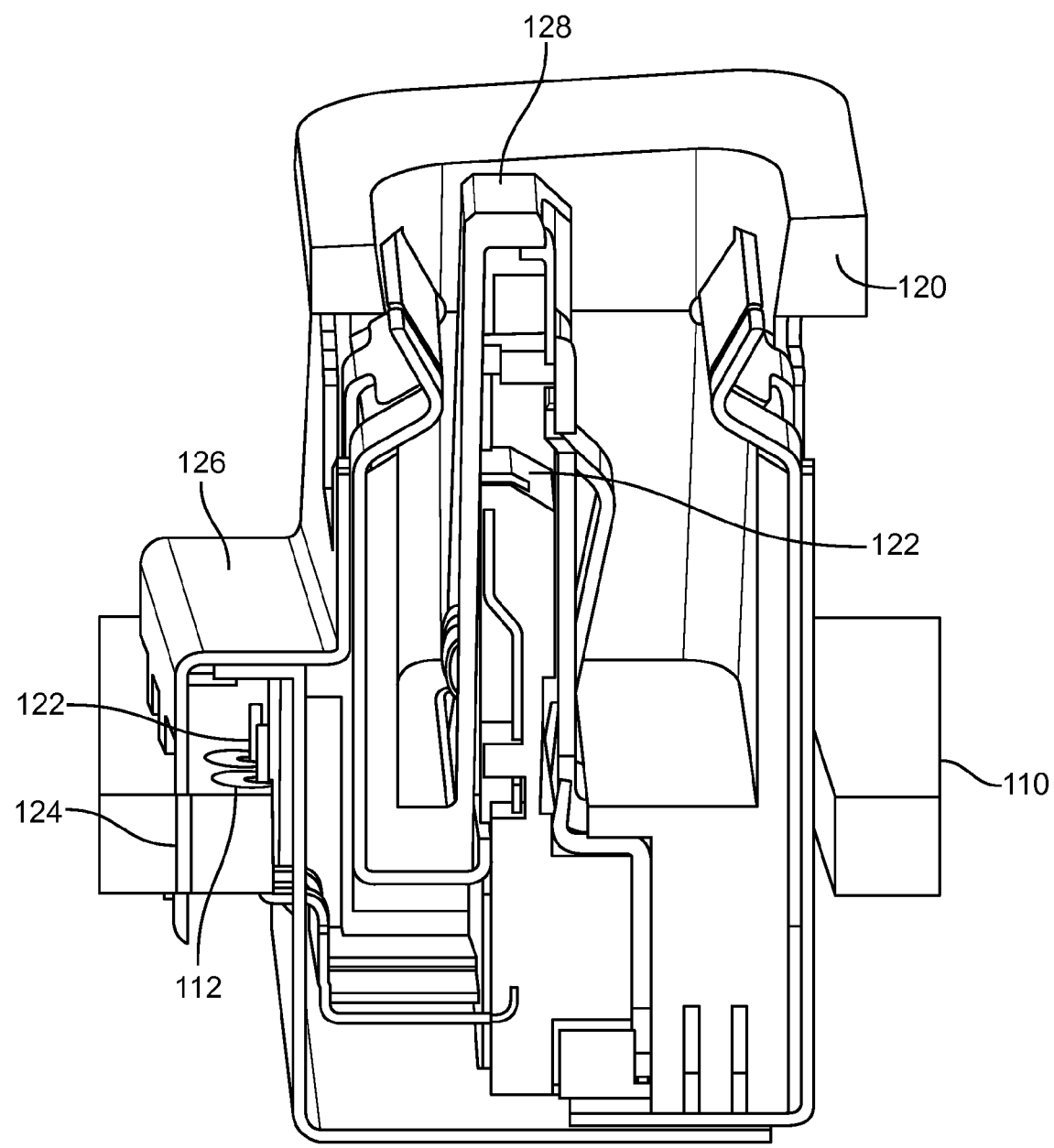
FIG. 4 illustrates a cross-section view of a connector receptacle assembly according to an embodiment of the present invention.

FIG. 4 illustrates a cross-section view of a connector receptacle assembly according to an embodiment of the present invention. Connector receptacle 120 includes an opening at its top (as shown here) for accepting a connector insert. Tongue 128 may support contacts 122, which may mate with contacts in a connector insert. As before, connector receptacle 120 may fit in an opening in printed circuit board 110. Contact 122 may form a U-shape, emerging upward to make an electrical connection to edge contact 112. Shield 126 may include tabs 124 that may be connected to printed circuit board 110.

Figure 5:
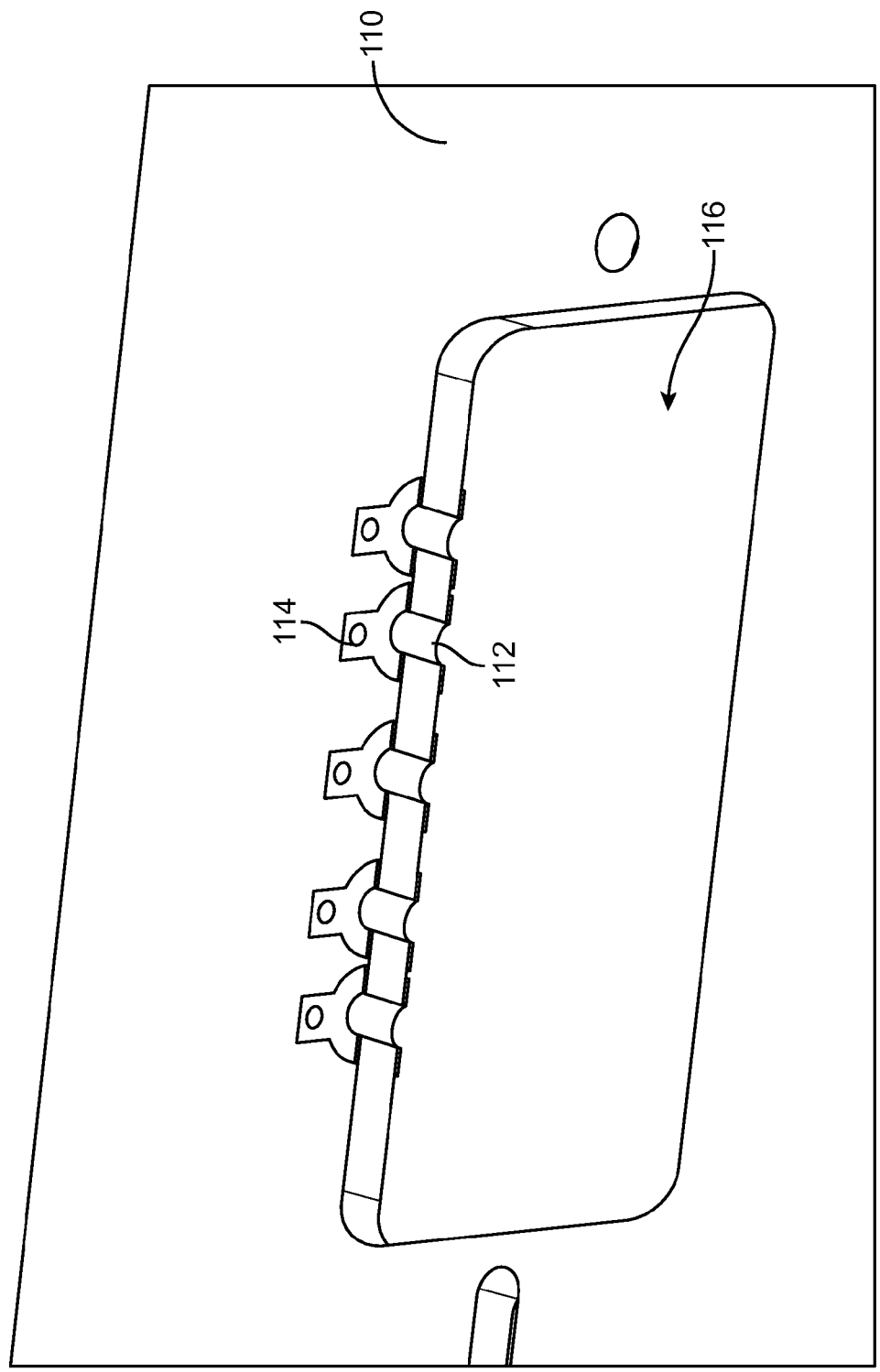
FIG. 5 illustrates a portion of a printed circuit board according to an embodiment of the present invention.

FIG. 5 illustrates a portion of a printed circuit board according to an embodiment of the present invention. Printed circuit board 110 may include opening 116. Edge contacts 112 may be located on one or more sides of opening 116. Edge contacts 112 may be reinforced by plated through-holes 114. Through-holes 114 may connect to edge contacts 112 on one or more layers of printed circuit board 110.

In various embodiments of the present invention, printed circuit board 110 may have an opening, such as opening 116, for accepting a connector receptacle. In other embodiments of the present invention, edge contacts may be located along an edge of printed circuit board 110. In still other embodiments, they may be located along one or more sides of the notch in printed circuit board 110. Opening 116 may be partially rectangular, as shown, or it may have other shapes, such squares or circles.

Edge contacts 112 may have various shapes. For example, edge contacts 112 may be rounded, as shown here. In other embodiments of the present invention, they may be square, as shown below, or formed of other angles.

In a specific embodiment of the present invention, edge contacts 112 may be formed by plating through-holes. In various embodiments of the present invention, these through-holes may have various sizes. For example, they may have diameters of approximately 0.6 mm, though they may have different sized diameters. For example, they may have diameters in the range of 0.6 to 0.7, 0.4 to 0.8 mm, or other ranges.

These openings may further have a plating overlap of approximately 0.3 mm. Opening 116 may be formed, cutting through these through-holes, leaving plated edge contacts 112 behind. Opening 116 may be formed using a router, laser, or other mechanical or non-mechanical system. Various layers may be employed between edge contacts 112 and printed circuit board 110 to improve adhesion between the two.

Figure 6:
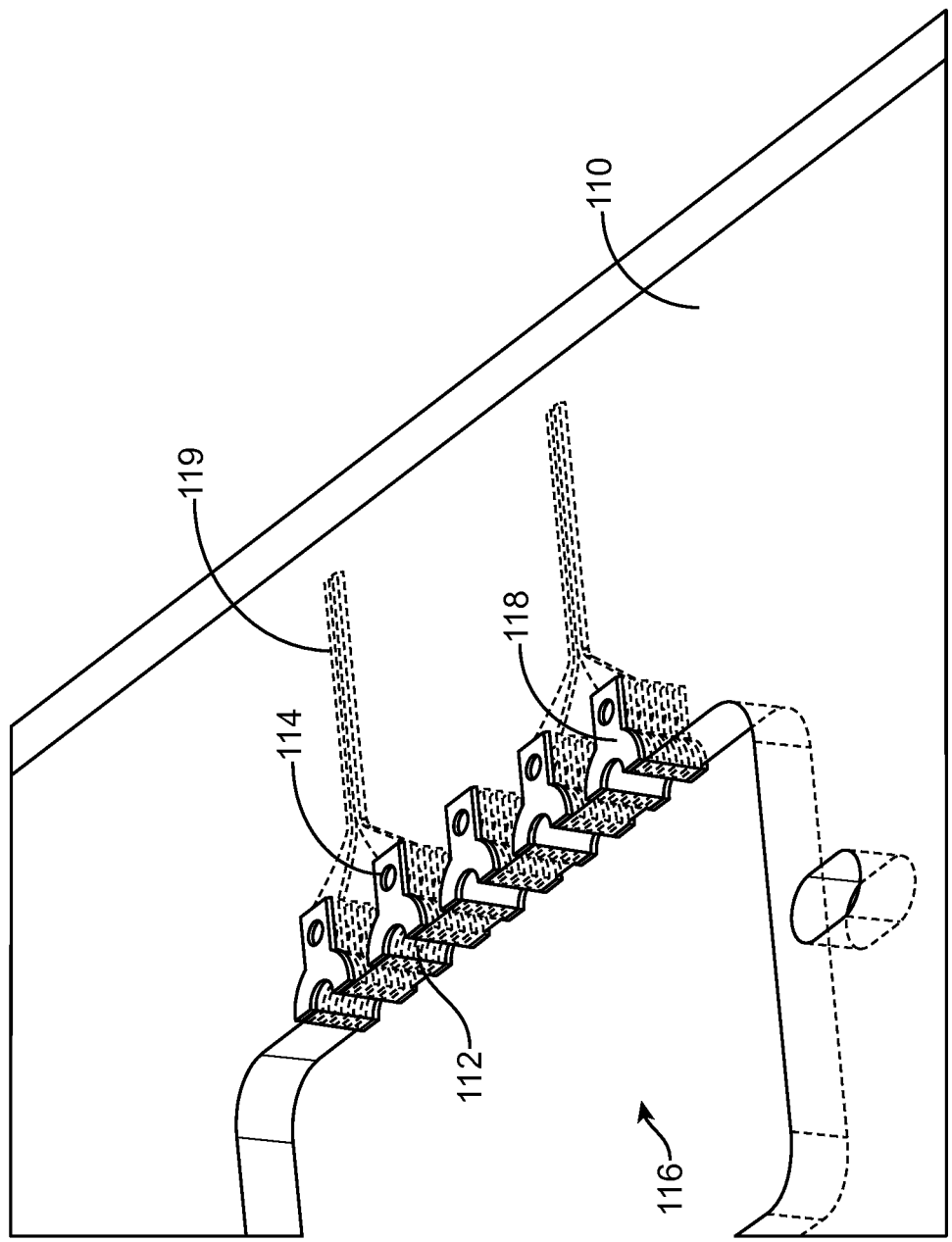
FIG. 6 illustrates a cutaway view of edge contacts according to an embodiment of the present invention.

FIG. 6 illustrates a cutaway view of edge contacts according to an embodiment of the present invention. In this particular example, edge contacts 112 may be reinforced by through-holes 114. In other embodiments the present invention, edge contacts 112 are not reinforced in this manner, though they may be reinforced in other ways. Via or through-hole 114 may be plated, and may connect to edge contacts 112 on one or more layers of printed circuit board 110. Traces 119 may connect edge contacts 112 to other circuitry or components on printed circuit board 110.

Again, edge contacts 112 may have various shapes. They may be concave or rounded, as shown above, or they may be flat as shown in the following figure. In still other embodiments of the present invention, edge contacts 112 may be formed having other shapes, such as notches, or angles shapes formed by 45-degree angles.

Figure 7:
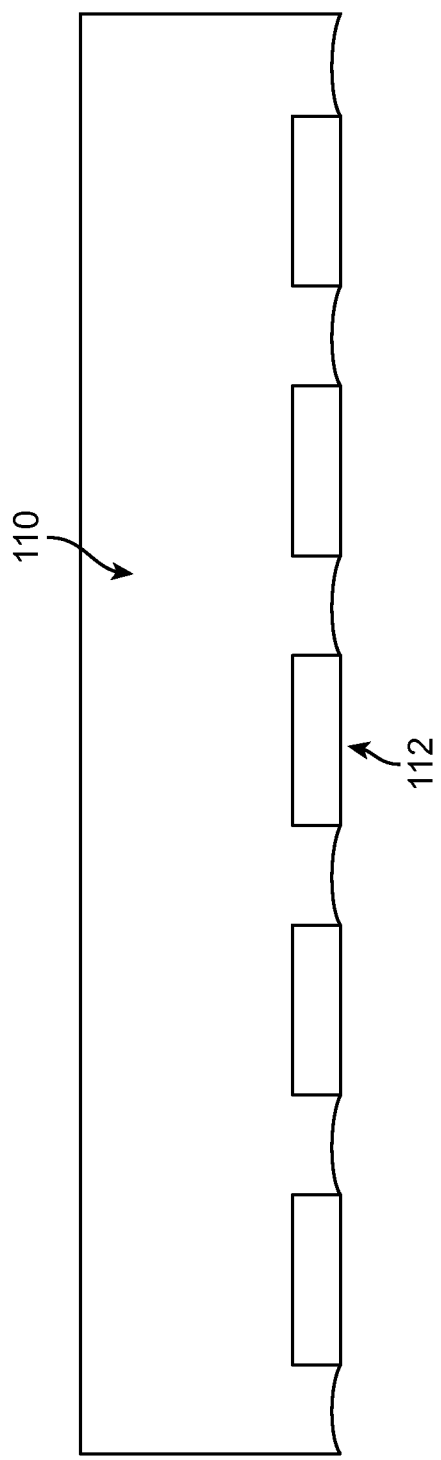
FIG. 7 illustrates edge contacts having flat surfaces.

FIG. 7 illustrates edge contacts having flat surfaces. These edge contacts 112 may be located along one or more sides of an opening in printed circuit board 110. Edge contacts 112 may be formed by using a laser or other method. For example, a laser may be used to remove material between edge contacts 112. In one specific embodiment of the present invention, traces connecting to edge contacts 112 may be used to align a laser for improved accuracy.

Again, in various embodiments of the present invention, a connector receptacle may be inserted into an opening in a printed circuit board. Connector receptacle contacts may align with and come in contact with edge contacts of a printed circuit board, thereby holding the connector receptacle place. To ensure a secure fit, the connector receptacle contacts may have a spring tension. This spring tension may be achieved by putting a bend or angle in the connector receptacle contact, though in other embodiments of the present invention, such a technique is not employed. Examples are shown in the following figure.

Figure 8:
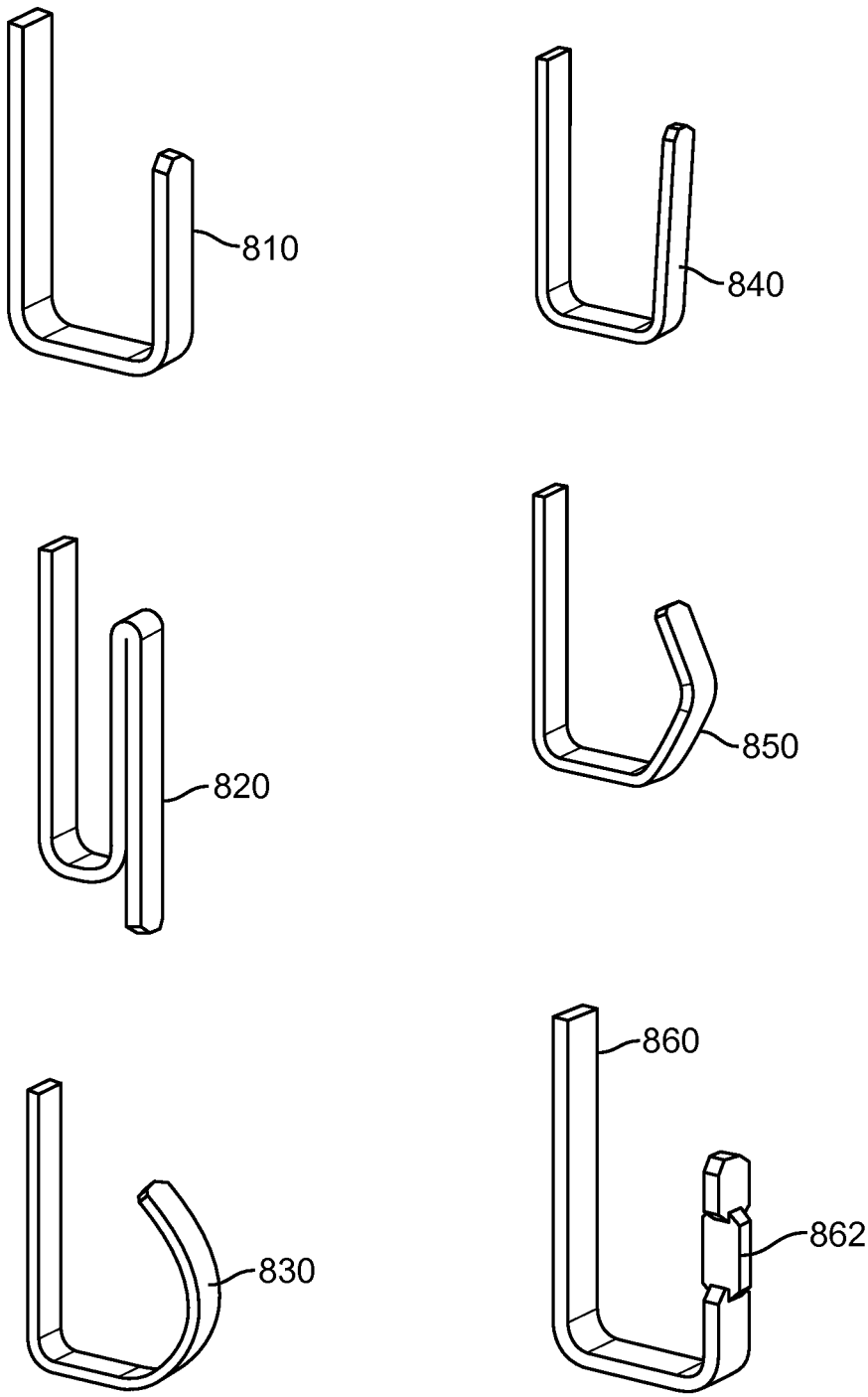
FIG. 8 illustrates a variety of connector receptacle contacts according to embodiments of the present invention.

FIG. 8 illustrates a variety of connector receptacle contacts according to embodiments of the present invention. These contacts may be used as contacts 122 in these examples, or as other contacts in other embodiments of the present invention.

Contact 810 may be a "U"-shaped contact. Typically, the returning upper portion is connected to an edge contact. Contact 820 may include a returning downward portion. This returning downward portion may be used to align a connector receptacle to an opening in a printed circuit board during assembly. Specifically, the inclusion of the downward portion makes contact 820 appear more as a typical contact (which typically emerges from a connector receptacle in a downward direction) during the assembly process. A "D"-shaped contact shown as contact 830. The "D" shape may be used to provide a spring tension. Contact 840 similarly may provide a spring tension by having a return portion bent forward a small angle. Contact 850 is similar to contact 830, but may be formed, stamped, or machined to have sharper angle bends rather than the smooth "D" curve of contact 830. Contact 860 may include a flattened portion 862 that may make an improved electrical connection to an edge contact.

In various embodiments of the present invention, connector receptacle contacts 122 may be formed of various materials. For example, contacts 122 may be formed using phosphor bronze, titanium copper, a copper-nickel-silicon alloy, or other material. Contacts 122 may be further plated using tin, silver, gold, or other material.

Again, various contacts, such as contact 840, may include an angled portion to improve an electrical connection to an edge contact. An example is shown in the following figure.

Figure 9:
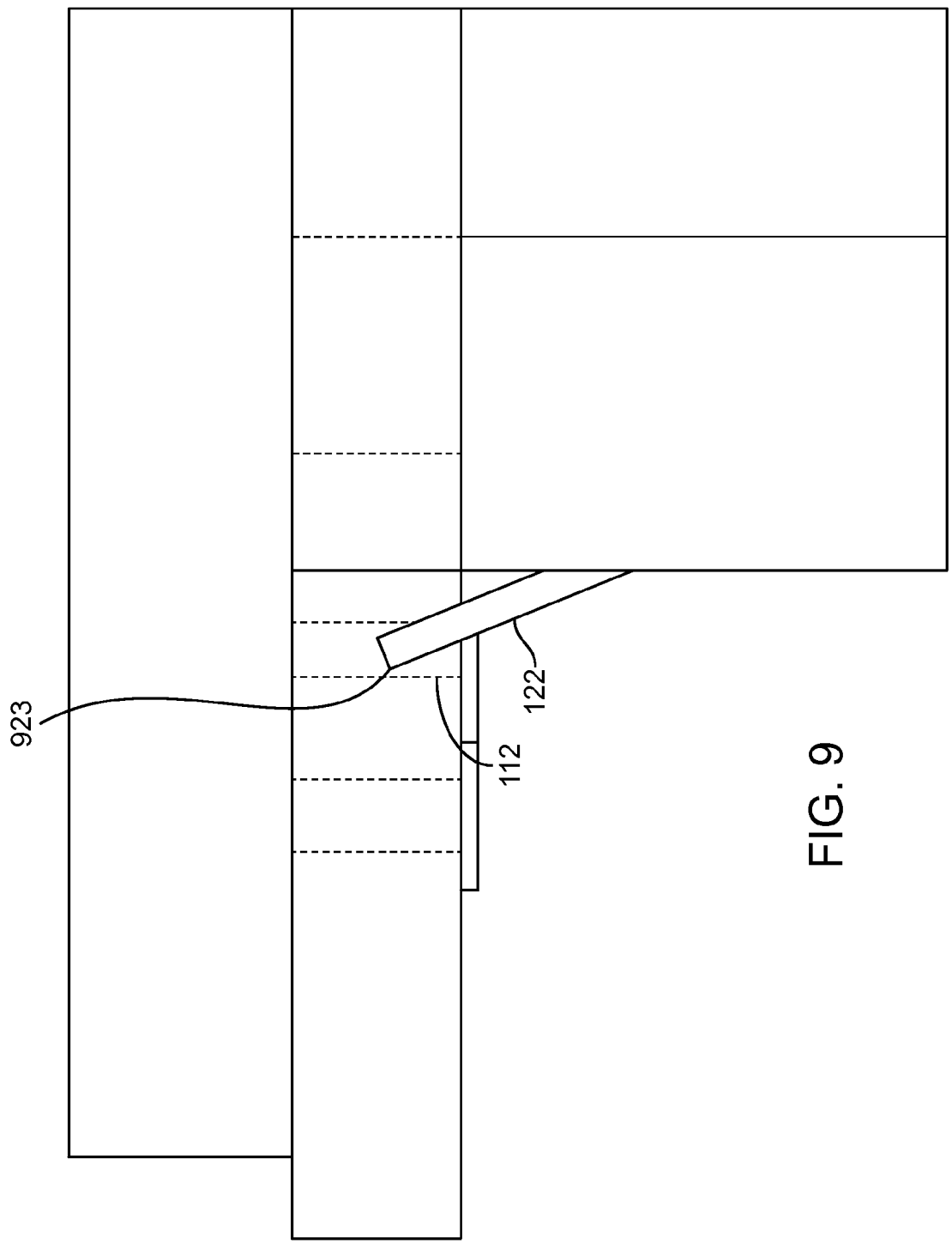
FIG. 9 illustrates a connection between a connector receptacle contact an edge contact according to an embodiment of the present invention.

FIG. 9 illustrates a connection between a connector receptacle contact and edge contact according to an embodiment of the present invention. In this example, connector receptacle 122 forms an electrical connection with edge contact 112 at edge 923. Contact 122 may be under positive spring force, thereby ensuring that an electrical connection at edge 923 is formed.

A problem may arise if a connector receptacle contact having a flat edge is flush against an edge contact during assembly. This may prevent solder from flowing between the connector receptacle contact and edge contact, thereby forming an unreliable electrical connection. Also, during assembly (when connector receptacle 120 is inserted in opening 116 in printed circuit board 110), a flat edged connector receptacle contact 122 may strip away the plating of edge contact 112, thereby damaging the electrical connection between them. Accordingly, embodiments of the present invention therefore may include one or more features on a surface of connector receptacle contact 122. These surface features may provide a separation between connector receptacle contact 122 and edge contact 112, and may protect a surface of edge contact 112 during assembly. An example is shown in the following figure.

Figure 10:
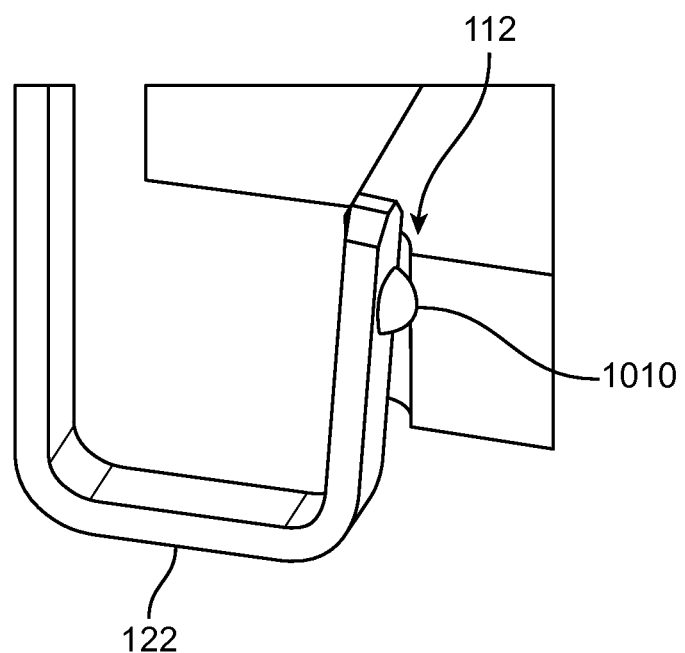
FIG. 10 illustrates a connector receptacle contact including a surface feature according to an embodiment of the present invention.

FIG. 10 illustrates a connector receptacle contact including a surface feature according to an embodiment of the present invention. In this specific example, the feature 1010 is a dimple, though in other embodiments of the present invention, other features may be used. For example, flat portion 862 of contact 860 in FIG. 8 may be used to provide a similar function. Dimple 1010 controls a spacing between connector receptacle contact 122 and edge contact 112, thereby ensuring that solder may flow between connector receptacle contact 122 and edge contact 112 in order to form a reliable electrical connection. Also, the use of dimple 1010 diminishes the possibility of damage to edge connector 112 during assembly. Again, in other embodiments of the present invention, other surface features, such as raised portions, domes, tabs, flat portions (such as 862) or others may be used.

The above description of embodiments of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications to thereby enable others skilled in the art to best utilize the invention in various embodiments and with various modifications as are suited to the particular use contemplated. Thus, it will be appreciated that the invention is intended to cover all modifications and equivalents within the scope of the following claims.

What is claimed is:
1. A connector receptacle assembly comprising:
a printed circuit board having an opening, the opening having a first inside edge, a plurality of edge contacts along the first inside edge, each of the plurality of edge contacts having a semicircular concave shape and formed at the first inside edge of the opening, and a via near at least one of the edge contacts, wherein the via and the at least one edge contact are connected by a trace on at least one layer of the printed circuit board; and a connector receptacle having a plurality of signal contacts, each soldered to a corresponding one of the plurality of edge contacts at the first inside edge of the opening.

2. The connector receptacle assembly of claim 1 wherein at least one of the signal contacts has a "U" shape.

3. The connector receptacle assembly of claim 1 wherein at least one of the signal contacts has a dimpled surface facing a corresponding edge contact.

4. A method of attaching a connector receptacle to a printed circuit board, the method comprising:

providing a printed circuit board having a plurality of edge contacts, each of the plurality of edge contacts having a semicircular concave shape and formed along an inside edge of an opening in the printed circuit board;

providing a connector receptacle having a housing and a plurality of contacts;

inserting the connector receptacle into the opening in the printed circuit board such that the plurality of connector receptacle contacts are aligned with the plurality of edge contacts; and soldering the plurality of connector receptacle contacts to the plurality of edge contacts; and reinforcing at least one of the edge contacts by providing a via near the at least one of the edge contacts, and connecting the via and the at least one edge contact using a trace on at least one layer of the printed circuit board.

5. The method of claim 4 wherein the opening in the printed circuit board is formed using a router.

6. The method of claim 4 wherein the plurality of edge contacts are formed by forming a via in the printed circuit board, plating the via, and removing approximately one-half the via using a router.

7. The method of claim 4 wherein providing a printed circuit board having a plurality of edge contacts along edges of an opening in the printed circuit board comprises:

forming a plurality of vias;

plating the plurality of vias; and forming the opening in the printed circuit boards such that approximately one-half of the vias are removed.

8. The method of claim 4 wherein providing a connector receptacle having a housing and a plurality of contacts comprises:

providing a plurality of contacts having a "U" shape.

9. A connector receptacle assembly comprising:

a printed circuit board having a plurality of edge contacts, each of the plurality of edge contacts having a semicircular concave shape and formed along an inside edge of a first opening in the printed circuit board, the printed circuit board further comprising a via near at least one of the edge contacts, wherein the via and the at least one edge contact are connected by a trace on at least one layer of the printed circuit board; and a connector receptacle having a plurality of contacts arranged to mate with the plurality of edge contacts.

10. The connector receptacle assembly of claim 9 wherein at least one of the signal contacts has a "U" shape.

11. The connector receptacle assembly of claim 9 wherein at least one of the signal contacts has a dimpled surface facing a corresponding edge contact.

12. The connector receptacle assembly of claim 9 wherein the connector receptacle comprises a housing, wherein the housing fits in the opening in the printed circuit board.

* * * * *